US009972477B2

(12) United States Patent
Tan et al.

(10) Patent No.: US 9,972,477 B2
(45) Date of Patent: May 15, 2018

(54) MULTIPLE POINT GAS DELIVERY APPARATUS FOR ETCHING MATERIALS

(71) Applicant: Applied Materials, Inc., Santa Clara, CA (US)

(72) Inventors: Tien Fak Tan, Campbell, CA (US); Dmitry Lubomirsky, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 242 days.

(21) Appl. No.: 14/751,848

(22) Filed: Jun. 26, 2015

(65) Prior Publication Data

US 2015/0380218 A1 Dec. 31, 2015

Related U.S. Application Data

(60) Provisional application No. 62/018,533, filed on Jun. 28, 2014.

(51) Int. Cl.
*H01J 37/32* (2006.01)

(52) U.S. Cl.
CPC .... *H01J 37/32357* (2013.01); *H01J 37/3244* (2013.01); *H01J 37/32422* (2013.01); *H01J 37/32449* (2013.01); *H01J 37/32568* (2013.01)

(58) Field of Classification Search
CPC ............ H01J 37/32449; H01J 37/3244; H01J 37/32568; H01J 37/32357; H01J 37/32091; H01J 37/32082; C23C 16/45565
See application file for complete search history.

(56) References Cited

U.S. PATENT DOCUMENTS

| 7,247,819 | B2 | 7/2007 | Gotto et al. |
| 9,698,074 | B2 | 7/2017 | Merry et al. |
| 2008/0110400 | A1* | 5/2008 | Satou ............... H01J 37/32449 118/723 VE |
| 2009/0277587 | A1* | 11/2009 | Lubomirsky ....... C23C 16/4405 156/345.34 |
| 2011/0061810 | A1* | 3/2011 | Ganguly ............. H01L 21/0223 156/345.27 |
| 2012/0211484 | A1 | 8/2012 | Zhou et al. |

\* cited by examiner

*Primary Examiner* — Rekesh K Dhingra
*Assistant Examiner* — Laureen Chan
(74) *Attorney, Agent, or Firm* — Patterson + Sheridan LLP

(57) ABSTRACT

Implementations of the present disclosure relate to an electrode assembly for a processing chamber. In one implementation, the electrode assembly includes a cathode electrode having an inner volume and a ground anode electrode spaced apart from the cathode electrode. A first etchant gas is introduced through the cathode electrode and into the inner volume. The first etchant gas is ionized within the inner volume. The ionized first etchant gas is filtered to allow only radicals to flow from the inner volume into a mixing volume formed within the ground anode electrode. The mixing volume is separated from the inner volume by a gas injection ring. The radicals from the first etchant gas are mixed and reacted with a second etchant gas in molecular phase, which is introduced through the ground anode electrode into a sidewall of the gas injection ring before entering the mixing volume in an evenly distributed manner.

12 Claims, 2 Drawing Sheets

MULTIPLE POINT GAS DELIVERY APPARATUS FOR ETCHING MATERIALS

CROSS-REFERENCE TO RELATED APPLICATIONS

This application claims benefit of U.S. provisional patent application Ser. No. 62/018,533, filed Jun. 28, 2014, which is herein incorporated by reference.

BACKGROUND

Field

Implementations of the present disclosure generally relate to an apparatus for processing a substrate. More particularly, implementations of the present disclosure relate to an improved electrode assembly disposed at an upper end of a processing chamber.

Description of the Related Art

In the fabrication of semiconductor devices, plasma processing chambers are commonly used to perform various fabrication processes such as etching, chemical vapor deposition (CVD), and physical vapor deposition (PVD). Generally, a vacuum pump maintains a very low pressure within the plasma processing chamber while a mixture of process gases continuously flows into the chamber and an electrical power source excites the gases into a plasma state. The constituents of the process gas mixture are chosen to effect the desired fabrication process.

In some conventional plasma processing chamber designs where plasma is generated in a cavity defined between a cathode electrode and a ground anode electrode, ion bombardment of metal electrodes may generate unwanted particles. For example, fluorine ions may bombard the cathode or ground anode electrodes made of aluminum or an aluminum alloy and generate unwanted aluminum fluoride (AlFx) particles that may contaminate a substrate being processed in the chamber. In some dry etch processes, such as one utilizing ammonia and fluorine-containing gases, the ammonia and fluorine-containing gases are introduced as a gas mixture into the cavity while a RF power is applied between the cathode electrode and the ground anode electrode to generate plasma from the gas mixture. As the cathode electrode would require higher RF power to break down both ammonia and fluorine-containing gases in the gas mixture, the substrate contamination issue caused by ion bombardment of the electrodes, especially the cathode electrode, is aggravated.

Therefore, there is a need in the art for an apparatus that effectively reduces the generation of contaminating particles on a substrate surface during plasma processing.

SUMMARY

Implementations of the present disclosure generally relate to an improved electrode assembly for a processing chamber. In one implementation, an electrode assembly is provided. The electrode assembly includes a cathode electrode having an upper side, a lower side, and an inner volume open at the lower side, wherein the cathode electrode and the inner volume are substantially symmetric about a central axis extending from the upper side to the lower side, a first gas channel formed through the cathode electrode and open to the inner volume, a ground anode electrode disposed opposing the cathode electrode, the ground anode electrode has a recessed portion and an opening defining a mixing volume beneath the recessed portion, and the recessed portion and the opening are disposed symmetric about the central axis, and a gas injection ring disposed within the recessed portion, wherein the gas injection ring has one or more apertures disposed around a circumference of the gas injection ring, and the one or more apertures are open to the mixing volume.

In another implementation, an electrode assembly for use in a processing chamber is provided. The electrode assembly includes a first electrode coupled to an RF power supply, comprising a conductive body having an upper side, a lower side, and an inner volume open at the lower side, wherein the conductive body and the inner volume are substantially symmetric about a central axis extending from the upper side to the lower side, and a first gas channel formed through the conductive body and open to the inner volume. The electrode assembly also includes a second electrode opposing the first electrode. The second electrode has a recessed portion formed in an upper surface of the second electrode and one or more through holes disposed at a bottom surface of the second electrode, the recessed portion and the one or more through holes defining a mixing volume therebetween, and the mixing volume is in fluid communication with the inner volume, and a gas injection ring received within the recessed portion, the gas injection ring has one or more apertures disposed around a circumference of the gas injection ring, and the one or more apertures are open to the mixing volume.

In yet another implementation, an apparatus for processing a substrate is provided. The apparatus includes a chamber body defining a chamber volume, an electrode assembly disposed above the chamber volume, wherein the electrode assembly comprises a first electrode coupled to an RF power supply, comprising a conductive body having an upper side, a lower side, and an inner volume open at the lower side, wherein the conductive body and the inner volume are substantially symmetric about a central axis extending from the upper side to the lower side, and a first gas channel formed through the conductive body and open to the inner volume, a second electrode opposing the first electrode, the second electrode has a recessed portion formed in an upper surface of the second electrode and one or more through holes disposed at a bottom surface of the second electrode, the recessed portion and the one or more through holes defining a mixing volume therebetween, and the mixing volume is in fluid communication with the inner volume, and a gas injection ring received within the recessed portion, the gas injection ring has one or more apertures disposed around a circumference of the gas injection ring, and the one or more apertures are open to the mixing volume, and a substrate support assembly disposed relatively below the electrode assembly.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
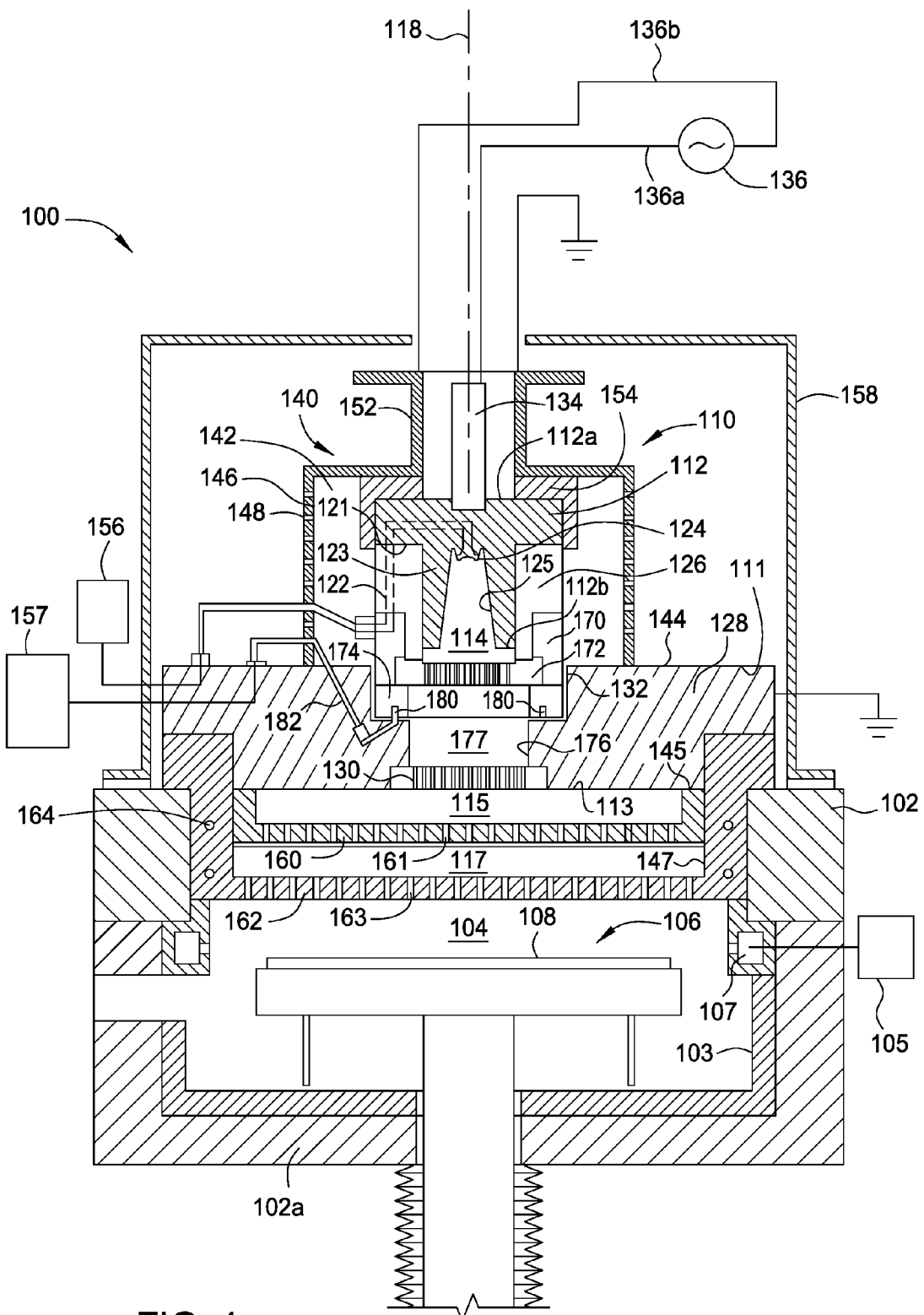
FIG. 1 is a schematic sectional view of a plasma processing chamber according to one implementation of the present disclosure.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Implementations of the present disclosure generally relate to an improved electrode assembly for a processing chamber. In various implementations, the electrode assembly includes at least a hollow cathode electrode (coupled to an RF power supply) having an inner volume and a ground anode electrode spaced apart from the hollow cathode electrode facing the inner volume. A first etchant gas from a first gas source is introduced through the hollow cathode electrode and into the inner volume. The first etchant gas can be ionized within the inner volume or introduced in plasma form from a remote plasma source. In either case, the ionized first etchant gas is filtered to predominantly allow radicals to flow from the inner volume into a mixing volume formed within the ground anode electrode. The mixing volume is separated from the inner volume by a gas injection ring. The radicals from the first etchant gas are mixed and reacted with a second etchant gas in molecular phase, which is introduced through the ground anode electrode into a sidewall of the gas injection ring before entering the mixing volume in an evenly distributed manner.

The inclusion of the gas injection ring allows the second etchant gas to be introduced into the mixing volume separately from the first etchant gas without going through the plasma breakdown. Therefore, the RF power required to the hollow cathode electrode for breaking down the first etchant gas is significantly less than the RF power otherwise would require if the first and second etchant gases were both introduced via the same gas inlet passing through the hollow cathode electrode. Details of the disclosure and various implementations are discussed below.

Exemplary Chamber Hardware

FIG. 1 is a schematic sectional view of a plasma processing chamber 100 according to one implementation of the present disclosure. The plasma processing chamber 100 includes an electrode assembly 110 with a dual gas injection assembly according to various implementations of the present disclosure. The plasma processing chamber 100 generally includes a chamber body 102 and a liner 103 disposed inside the chamber body 102. The liner 103 defines a chamber volume 104 for substrate processing. A substrate support assembly 106 is disposed in the chamber volume 104 to support a substrate 108 to be processed. An exhaust plenum 107 may be formed in the liner 103 and connected with a vacuum pump 105 to maintain a low pressured process environment during operation. Alternatively, the vacuum pump 105 may be connected to a vacuum port formed on a bottom 102a of the chamber body 102. The vacuum port may be formed off center from the substrate support assembly 106 or concentrically around the substrate support assembly 106.

The electrode assembly 110 is disposed above the chamber body 102 for supplying processing gas in plasma form and/or molecular form to the chamber volume 104. The electrode assembly 110 includes a hollow cathode electrode 112, a ground anode electrode 128 (i.e., the anode electrode 128 is grounded), and an isolator 126 disposed between the hollow cathode electrode 112 and the ground anode electrode 128. The hollow cathode electrode 112 has a first inner volume 114, which may serve as plasma cavity during plasma generation if the processing gas is introduced into the hollow cathode electrode 112 in molecular form. The hollow cathode electrode 112 includes a conductive body having an upper side 112a and a lower side 112b. A central axis 118 extends from the upper side 112a to the lower side 112b. The hollow cathode electrode 112 and the first inner volume 114 may be symmetric about the central axis 118. The first inner volume 114 opens at the lower side 112b and creates a cavity between the hollow cathode electrode 112 and the ground anode electrode 128. The hollow cathode electrode 112, or at least the inner surface 125 of the hollow cathode electrode 112 may be formed from a RF conductive material such as aluminum, anodized aluminum, nickel plated aluminum, stainless steel, or combinations and alloys thereof.

In one implementation, the hollow cathode electrode 112 has an expanding section 123 housing the first inner volume 114, which is in fluid communication with a first gas channel 122. A first gas channel 122 is formed in the hollow cathode electrode 112 for delivering one or more first etchant gases in either plasma form or molecular form from a first gas source 156 to the first inner volume 114 of the hollow cathode electrode 112. In one implementation, the first etchant gas in plasma form is introduced to the first inner volume 114 through the first gas channel 122 from a remote plasma source. In some implementations, the gas channel 122 may include a plurality of outlets 124 formed around the upper end of the expanding section 123. The plurality of outlets 124 may be evenly distributed about the central axis 118 so that the first etchant gas may be delivered to the first inner volume 114 in a uniform and symmetrical manner.

The isolator 126 is positioned between the hollow cathode electrode 112 and the ground anode electrode 128 to electrically isolate the hollow cathode electrode 112 from the ground anode electrode 128. The isolator 126 may be a ring-shaped body surrounding, or substantially surrounding at least the expanding section 123. The isolator 126 may be made from a dielectric material such as aluminum oxide, or any other insulative, process compatible material.

As will be discussed in more detail in FIG. 2, the isolator 126 is supported by a support ring 170 and a first diffuser plate 172 surrounded by the support ring 170. The support ring 170 and the first diffuser plate 172 are supported by a gas injection ring 174. The gas injection ring 174 has one or more apertures 180 configured to supply a second etchant gas. The apertures 180 are in fluid communication with a second gas source 157 through a second gas channel 182 formed in the ground anode electrode 128. The gas injection ring 174 and the support ring 170 are sized to be received within a recessed portion 132 formed in the upper surface 111 the ground anode electrode 128.

The ground anode electrode 128 may be a conductive plate formed from one or more process compatible materials, such as aluminum, anodized aluminum, nickel plated aluminum, stainless steel, or combinations and alloys thereof. The outer diameter of the ground anode electrode 128 can be designed to mount or rest on an outer diameter of a showerhead 162. In one implementation, the ground anode electrode 128 has an opening 176 formed beneath the recessed portion 132. The opening 176 extends a desired thickness within the ground anode electrode 128. The opening 176, the gas injection ring 174, the first diffuser plate 172, and the support ring 170 are symmetrical about the central axis 118. The ground anode electrode 128 also includes one or more through holes 130 formed beneath the opening 176. The one or more through holes 130 may be disposed symmetrical about the central axis 118. The through holes 130 may be provided in a diffuser plate 184 disposed at the bottom surface 113 of the ground anode electrode 128. Alternatively, the through holes 130 may be formed through the bottom surface 113 of the ground anode electrode 128. In either case, the opening 176 between the gas injection ring 174 and the through holes 130 defines a mixing volume 177 to allow mixing of the first etchant gas from the first inner volume 114 and the second etchant gas from the apertures 180 to form an etchant gas with required characteristics.

In some implementations, an optional RF connector 134 may be attached to the hollow cathode electrode 112 from the upper side 112a. The RF connector 134 may be disposed along the central axis 118 to provide electrical symmetry with a central RF feed configuration. The RF connector 134 may be coupled to a RF output 136a of a RF power source 136 so that the hollow cathode electrode 112 is RF hot during operation.

The plasma processing chamber 100 further includes a RF ground shield assembly 140 that encloses the hollow cathode electrode 112 and the RF connector 134. During operation, a RF ground 136b of the RF power source 136 may be connected to the RF ground shield assembly 140. The RF ground shield assembly 140 forms a symmetric shell around the hollow cathode electrode 112 to provide a symmetric RF return path for the electrode assembly 110. The symmetric shell formed by the RF ground shield assembly 140 may also be continuous to improve uniformity of RF return path.

In one implementation, the RF ground shield assembly 140 may form a cylindrical shell defining an enclosed volume 142 in which the hollow cathode electrode 112 and the RF connector 134 are disposed. The RF ground shield assembly 140 may have a perforated sidewall 146 designed to mount or rest on a top surface 144 of the ground anode electrode 128. The perforated sidewall 146 extends upwardly from the top surface 144 of the ground anode electrode 128 to enclose the hollow cathode electrode 112 therein. The perforated sidewall 146 may have a plurality of openings 148 formed therethrough. The plurality of openings 148 are designed the enable heat convection therethrough without allowing RF leak. In one implementation, the size of the plurality of openings 148 may be selected to enable heat convection and prevent RF leaking. A gap (not shown) may be present between the ground anode electrode 128 and the perforated sidewall 146 so that the perforated sidewall 146 is not in direct contact with the ground anode electrode 128. The gap should allow room for thermal expansion caused during operation. In one implementation, an upper tube 152 may be attached to an upper surface of the RF ground shield assembly 140. The upper tube 152 may be smaller in diameter than the perforated sidewall 146 for surrounding the RF connector 134.

In one implementation, an isolator 154 may be disposed between the RF ground shield assembly 140 and the hollow cathode electrode 112 within the enclosed volume 142. The isolator 154 may be positioned so that the RF hot hollow cathode electrode 112 is not in the line of sight of the RF ground shield assembly 140 to prevent unwanted arcing.

An outer shell 158 may be disposed over the chamber body 102 to shield the electrode assembly 110 from any external noises, such as magnetic noises. In one implementation, the outer shell 158 may be formed from a material having high magnetic permeability, such as mu-metal.

A blocker plate 160 having a plurality of through openings 161 may be attached to a bottom surface 145 of the ground anode electrode 128. The blocker plate 160 may be sized to be received within an inner circumference 147 of a showerhead 162. In one implementation as shown, the outer diameter of the ground anode electrode 128 is rested on the outer diameter of the showerhead 162, with the blocker plate 160 sandwiched therebetween. The through openings 161 of the blocker plate 160 can be sized and positioned about the blocker plate 160 to provide a controlled and uniform distribution of the etchant gas flowing from the mixing volume 177. The showerhead 162 is substantially a disc-shaped plate having a plurality of gas openings 163 to uniformly distribute etchant gas passing through the blocker plate 160 into the chamber volume 104 where the substrate 108 to be processed is located. In one implementation, the showerhead 162 may have heating/cooling channels 164 formed therein to provide temperature control of the electrode assembly 110.

Exemplary Electrode Assembly

Figure 2:
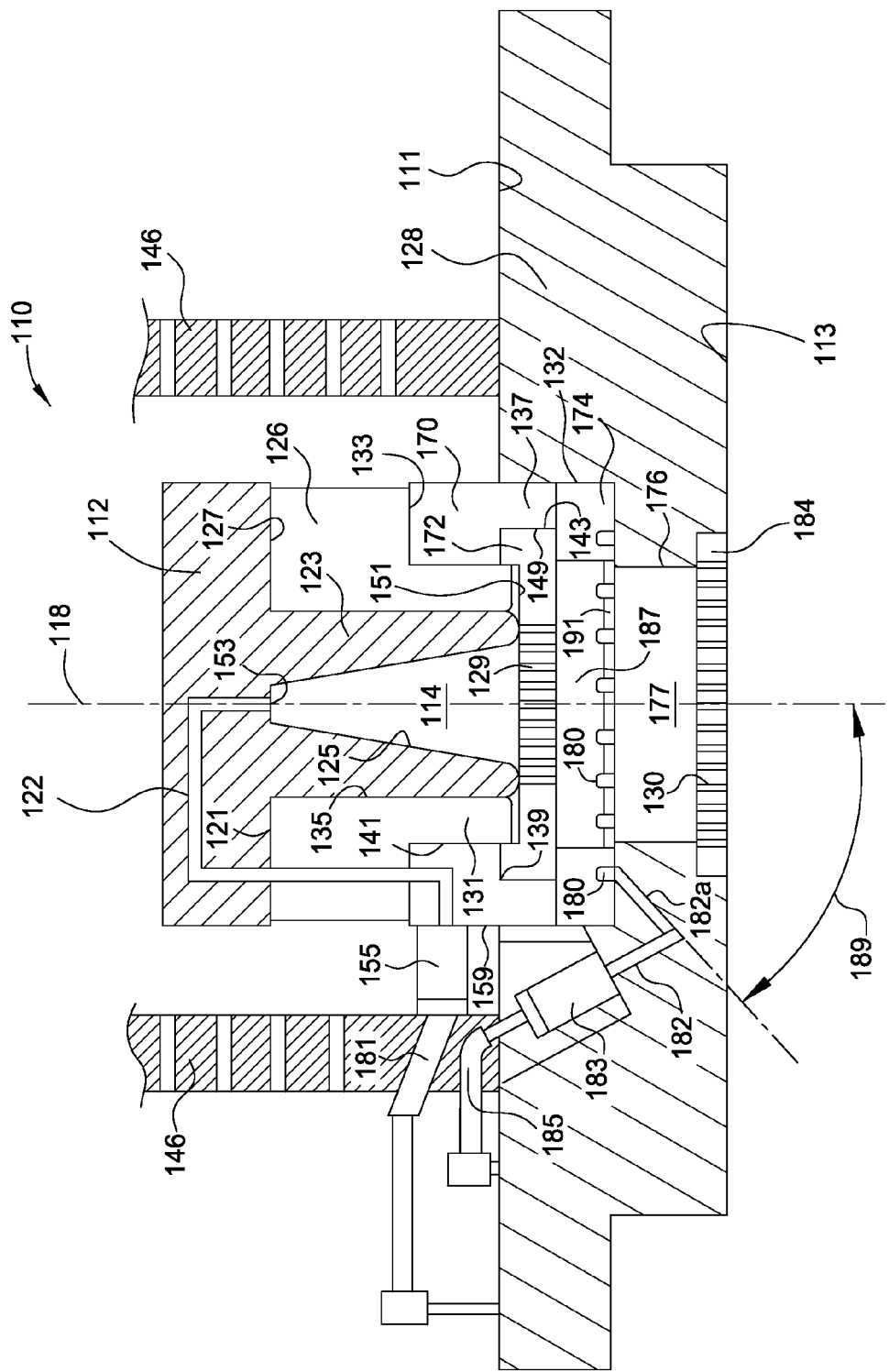
FIG. 2 is an enlarged, schematic sectional view of a portion of the electrode assembly of FIG. 1.

FIG. 2 is an enlarged, schematic sectional view of a portion of the electrode assembly 110 of FIG. 1 showing the dual gas injection assembly. In one implementation, the hollow cathode electrode 112 has a collar 121 extending laterally from an outer surface of the hollow cathode electrode 112 in a direction perpendicular to the central axis 118. The expanding section 123 projects from the outer surface of the hollow cathode electrode 112 along the central axis 118. The expanding section 123 houses the first inner volume 114, which is in fluid communication with the first gas channel 122. In one implementation, the expanding section 123 may be an annular member that has an inner surface or diameter 125 that gradually increases from an upper portion thereof to a lower portion thereof. The slope of the inner surface or diameter 125, or length of the expanding section 123, or both can vary depending on the volume of plasma needed for specific process requirements. As such, the distance between the hollow cathode electrode 112 and the ground anode electrode 128 is variable depending upon the power level needed to sustain the plasma within some portion of the first inner volume 114. The varying distance helps control the stability and/or formation of the plasma within the first inner volume 114.

The collar 121 of the hollow cathode electrode 112 is rested on an upper surface 127 of the isolator 126, which is supported by a support ring 170 and a portion of the first diffuser plate 172. In one implementation, the first diffuser plate 172 may be a disc-shaped plate having one or more through holes 129 formed about the central axis 118. The first diffuser plate 172 is generally surrounded by the support ring 170. In some implementations, the first diffuser plate 172 may provide a RF ground output terminal.

The isolator 126 may be a ring-shaped body having an annular extension 131 extending from its bottom surface 133 at the center region in a direction away from the upper surface 127. The inner circumference 135 of the isolator 126 is sized to receive the expanding section 123. The support ring 170 may have an annular extension 137 extending from its bottom surface at the peripheral region of the support ring 170, forming a notch 139 of the support ring 170. The inner circumference 141 of the upper portion of the support ring 170 is sized to receive the annular extension 131 of the isolator 126. The annular extension 137 of the support ring 170 is sized to receive the first diffuser plate 172 so that the inner circumference 143 of the lower portion of the annular extension 137 of the support ring 170 is held against a circumference surface 149 of the first diffuser plate 172. In other words, the peripheral portion of the first diffuser plate 172 is nestable in the notch 139 of the support ring 170. The isolator 126, upon assembly, is mounted or rested on the support ring 170 and having its annular extension 131 supported by an upper surface 151 of the first diffuser plate 172.

The first gas channel 122 has a gas outlet 153 disposed at the upper portion of the expanding section 123. In one implementation, the first gas channel 122 is configured to form through the hollow cathode electrode 112, and extend downwardly from the collar 121 through the isolator 126 and into the support ring 170. The first gas channel 122 connects to a first gas inlet 155 formed at the outer surface 159 of the support ring 170. The first gas inlet 155 is in fluid communication with the first gas source 156 (shown in FIG. 1) via a first gas pipe 181 that forms through the perforated sidewall 146.

The support ring 170 and the first diffuser plate 172 are supported by the gas injection ring 174. In one implementation, the bottom surfaces of the support ring 170 and the first diffuser plate 172 are substantially leveled with an upper surface of the gas injection ring 174. The ground anode electrode 128 has the recessed portion 132 and an opening 176 formed beneath the recessed portion 132. The recessed portion 132 and the opening 176 are symmetrical about the central axis 118. The inner circumference of the recessed portion 132 is sized to receive the gas injection ring 174 and at least a portion of the support ring 170. A second diffuser plate 184 having one or more through holes 130 may be disposed beneath the opening 176. The opening 176 between the second diffuser plate 184 and the gas injection ring 174 defines a mixing volume 177, which is in fluid communication with the inner volume 114. Alternatively, the second diffuser plate 184 may be integrally formed with the ground anode electrode 128 as a single component. That is, the ground anode electrode 128 is formed with a plurality of through holes at the bottom beneath the opening 176.

The gas injection ring 174 may be a ring-shaped body defining a ring-shaped interior plenum 187. In one implementation, the gas injection ring 174, the support ring 170, the first diffuser plate 172, and the second diffuser plate 184 may be made of aluminum, anodized aluminum, nickel plated aluminum, stainless steel, or combinations and alloys thereof. The gas injection ring 174 may have one or more apertures 180 evenly spaced around the circumference of the gas injection ring 174. The apertures 180 are open to the mixing volume 177. The apertures 180 may be in fluid communication with each other through a gas channel 191 disposed within the gas injection ring 174 around the circumference of the gas injection ring 174. The gas channel 191 provides a flow path between the apertures 180. The size, number, and position of the apertures 180 are configured to provide a uniform gas distribution of the second etchant gas into the mixing volume 177. The apertures 180 are in fluid communication with the second gas channel 182, which may be configured to form through the ground anode electrode 128. The second gas channel 182 may be connected to a single aperture 180 so that the second etchant gas is distributed to each of the apertures 180 through the gas channel 191.

In one implementation, the second gas channel 182 is connected to a second gas inlet 183 provided within the ground anode electrode 128. The second gas inlet 183 is in fluid communication with a second gas source 157 (shown in FIG. 1) via a second gas pipe 185 that forms through the perforated sidewall 146. In one implementation, a portion of the second gas channel 182, for example, the section 182a in direct contact with the aperture 180 may be tilted at an angle 189 from the central axis 118. The angle 189 may be about 35° to about 60°, for example about 45°. The gas injection ring 174 introduces the second etchant gas in a lateral manner into the interior plenum 187 through the apertures 180. The second etchant gas is then mixed in the mixing volume 177 with the first etchant gas flowing through the first diffuser plate 172.

The electrode assembly 110 of the present disclosure may be used to perform any suitable plasma processes. In one exemplary implementation, the electrode assembly 110 may be used to perform a dry etch process for removing silicon oxides or silicon nitrides using at least an ammonia ($NH_3$) and nitrogen trifluoride ($NF_3$). One exemplary dry etch process may be similar to or may include a SiCoNi™ etch process that is available from Applied Materials, Inc. of Santa Clara, Calif.

In operation, the first etchant gas comprising a fluorine-containing gas and an inert gas such as argon (Ar), helium (He), krypton (Kr) and/or nitrogen ($N_2$) is introduced into the first gas channel 122 and to the gas outlet 153 disposed at the upper portion of the expanding section 123. The first etchant gas may optionally contain a hydrogen-containing gas such as hydrogen. The fluorine-containing gas may include, but is not limited to fluorine gas ($F_2$), nitrogen trifluoride ($NF_3$) or anhydrous HF. In one implementation, the fluorine-containing gas is $NF_3$. An RF power setting of about 25W at an RF frequency of 13.56 MHz is coupled to the hollow cathode electrode 112, which is thus RF hot, to ionize the first etchant gas in the first inner volume 114. If desired, the first etchant gas may be energized by a microwave source. The plasma breakdown of the first etchant gas may be performed within the first inner volume 114 or occurred remotely in a remote plasma source (RPS). In either case, the through holes 129 of the first diffuser plate 172 disposed downstream of the first inner volume 114 filter out a desired amount of ions and predominantly allow only radicals (e.g., F radicals) from the first etchant gas to enter the interior plenum 187 and into the mixing volume 177.

The second etchant gas comprising a hydrogen-containing gas and an inner gas such as argon (Ar), helium (He), krypton (Kr) and/or nitrogen ($N_2$) is introduced into the second gas channel 182 and to the apertures 180 that are evenly spaced around the circumference of the gas injection ring 174. The hydrogen-containing gas may include, but is not limited to ammonia ($NH_3$), hydrazine ($N_2H_4$), or $H_2$. In one implementation, the hydrogen-containing gas is $NH_3$. The second etchant gas may be introduced into the second gas channel 182 in molecular form, or in plasma form (from a remote plasma source). In one implementation, the second etchant gas is introduced into the second gas channel 182 in molecular form. The second etchant gas is flowed to the interior plenum 187 and into the mixing volume 177 to mix with the radicals (e.g., F radicals) from the first etchant gas. The second etchant gas, e.g., $NH_3$, reacts with F radicals to form an etchant mixture with required characteristics.

The resulting etchant mixture flows through the through holes 130 of the second diffuser plate 184 to evenly distribute into a second inner volume 115 (FIG. 1) defined between the ground anode electrode 128 and the blocker plate 160, and into a third inner volume 117 (FIG. 1) defined between the blocker plate 160 and the showerhead 162, and then into the chamber volume 104 (FIG. 1) where the substrate to be processed is located. The surface of the substrate is exposed to, and reacted with the etchant mixture to selectively remove silicon oxide or silicon nitride from the surface of the substrate. During the dry etch process, the substrate may be heated to a desired temperature, such as about 80° C. or more, to help remove the silicon oxide or silicon nitride from the substrate.

Benefits of the present disclosure lie in that the dual gas injection assembly using the first gas channel 122 and the second gas channel 182 of the electrode assembly 110 significantly reduces the substrate contamination issue as discussed in the background section of this disclosure. The inclusion of the gas injection ring 174 allows the second etchant gas to be introduced into the mixing volume 177 separately from the first etchant gas without going through the plasma breakdown occurred within the inner volume 114. In addition, the uniform distribution of apertures of the ground anode electrode, injection ring and second diffuser plate are designed to optimize gas mixing. Therefore, the RF power required to the hollow cathode electrode 112 for breaking down the first etchant gas is significantly less than the RF power otherwise would require if the first and second etchant gases were both introduced via the same gas channel (i.e., the first gas channel 122) passing through the hollow cathode electrode 112. Since the RF power applied to the hollow cathode electrode 112 is reduced, for example by about one-third in rectified voltage, the substrate contamination issue caused by ion bombardment of the electrodes, especially the hollow cathode electrode, is alleviated or reduced. The dual gas injection assembly also improves the process window because $NH_3$ or other chemicals used to form the etchant mixture can now be freely increased to achieve different process improvements without restriction by the RF power.

While the foregoing is directed to implementations of the present disclosure, other and further implementations of the disclosure may be devised without departing from the basic scope thereof, and the scope thereof is determined by the claims that follow.

The invention claimed is:

1. An electrode assembly, comprising:
a cathode electrode having an upper side, a lower side, and an inner volume open at the lower side, wherein the cathode electrode and the inner volume are substantially symmetric about a central axis extending from the upper side to the lower side;
   a first gas channel formed through the cathode electrode and open to the inner volume;
   a unitary ground anode electrode disposed opposing the cathode electrode, wherein the unitary ground anode electrode has a recessed portion in an upper surface and an opening defining a mixing volume beneath the recessed portion, and the recessed portion and the opening are disposed symmetric about the central axis;
   a first diffuser plate disposed above the mixing volume;
   a second diffuser plate disposed within the unitary ground anode electrode below the mixing volume; and
   a gas injection ring disposed within the recessed portion between the first diffuser plate and the second diffuser plate, wherein the gas injection ring has one or more apertures disposed around a circumference of the gas injection ring, and the one or more apertures are open to the mixing volume.

2. The electrode assembly of claim 1, wherein the first gas channel is in fluid communication with a first gas source, and the first gas source provides a first etchant gas in molecular or plasma form.

3. The electrode assembly of claim 1, further comprising:
   a second gas channel formed through the unitary ground anode electrode, wherein the one or more apertures are in fluid communication with a second gas source through the second gas channel.

4. The electrode assembly of claim 1, wherein the cathode electrode has an expanding section projecting from an outer surface of the cathode electrode along the central axis, and the expanding section houses the inner volume.

5. The electrode assembly of claim 4, wherein the expanding section has an inner diameter gradually increases from an upper portion of the expanding section to a lower portion of the expanding section.

6. The electrode assembly of claim 5, wherein the first diffuser plate is disposed between the expanding section and the gas injection ring, the first diffuser plate having one or more through holes disposed symmetric about the central axis.

7. The electrode assembly of claim 6, further comprising:
   a support ring disposed on the gas injection ring, wherein the support ring has an annular extension extending from its bottom surface along the central axis, and the annular extension has an inner circumference sized to receive the first diffuser plate.

8. The electrode assembly of claim 7, further comprising:
   an isolator supported by the support ring, wherein the isolator has an annular extension extending from its bottom surface along the central axis, and the annular extension of the isolator is disposed between the support ring and the expanding section.

9. The electrode assembly of claim 7, wherein the second diffuser plate has one or more through holes disposed symmetric about the central axis.

10. The electrode assembly of claim 7, wherein the gas injection ring, the support ring, the first diffuser plate, and the second diffuser plate are made of aluminum, anodized aluminum, nickel plated aluminum, stainless steel, or combinations and alloys thereof.

11. The electrode assembly of claim 1, further comprising:
   a showerhead; and
   a blocker plate disposed between the showerhead and the bottom surface of the unitary ground anode electrode.

12. The electrode assembly of claim 1, wherein the first diffuser plate provides a RF ground output terminal.

* * * * *